United States Patent
Sen et al.

(10) Patent No.: US 7,053,684 B1
(45) Date of Patent: May 30, 2006

(54) REDUCED JITTER CHARGE PUMPS AND CIRCUITS AND SYSTEMS UTILIZING THE SAME

(75) Inventors: Subhajit Sen, Pune (IN); Stephen Timothy Hodapp, Austin, TX (US); John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/833,451

(22) Filed: Apr. 28, 2004

(51) Int. Cl.
*H03L 7/06* (2006.01)

(52) U.S. Cl. .................... 327/157; 327/148; 327/111

(58) Field of Classification Search ............... 327/148, 327/157, 111, 112, 353–538, 589, 590, 52, 327/65, 96
See application file for complete search history.

(56) References Cited

U.S. PATENT DOCUMENTS

| | | | | |
|---|---|---|---|---|
| 5,363,066 A | * | 11/1994 | Chen et al. | 331/17 |
| 5,592,370 A | * | 1/1997 | Rogers | 363/60 |
| 6,075,406 A | * | 6/2000 | Lee et al. | 327/538 |
| 6,111,469 A | * | 8/2000 | Adachi | 331/17 |
| 6,124,755 A | | 9/2000 | Parker et al. | 327/543 |
| 6,278,332 B1 | * | 8/2001 | Nelson et al. | 331/17 |
| 6,326,852 B1 | * | 12/2001 | Wakayama | 331/17 |
| 6,535,051 B1 | * | 3/2003 | Kim | 327/536 |
| 6,608,511 B1 | | 8/2003 | Hsu | 327/157 |
| 6,639,475 B1 | * | 10/2003 | Ichimaru | 331/17 |
| 6,784,707 B1 | * | 8/2004 | Kim et al. | 327/158 |
| 6,812,755 B1 | * | 11/2004 | Yee et al. | 327/157 |
| 6,903,585 B1 | * | 6/2005 | Keaveney | 327/148 |

OTHER PUBLICATIONS

Young, I.A., Greason, J.K., Smith, J.E., and Wong, K.L. "A PLL Clock Generator with 5 to 100 MHz Lock Range for Microprocessors" IEEE Journal of Solid-State Circuits. Nov. 1992, pp. 1599-1611, vol. 27, No. 11, Intel Corp., USA.

\* cited by examiner

*Primary Examiner*—Timothy P. Callahan
*Assistant Examiner*—Hai L. Nguyen
(74) *Attorney, Agent, or Firm*—Thompson & Knight LLP; James J. Murphy

(57) ABSTRACT

A charge pump including a differential pair of transistors for controlling a current at a charge pump output node and a replica bias generator for selectively driving a first transistor of the differential pair of transistors into a fully-on state and a second transistor of the differential pair of transistors into a weak inversion state.

20 Claims, 5 Drawing Sheets

REDUCED JITTER CHARGE PUMPS AND CIRCUITS AND SYSTEMS UTILIZING THE SAME

FIELD OF INVENTION

The present invention relates in general to phase-locked loops and in particular to reduced jitter charge pumps and circuits and systems utilizing the same.

BACKGROUND OF INVENTION

Phase-locked loops (PLLs) are widely used in electronic circuits to generate signals with closely controlled timing relationships. A few of the wide range of PLL applications include integral and fractional clock signal multiplication, clock signal recovery from a data bitstream, clock signal and data re-timing and de-skewing, and clock signal synthesis. Generally, the PLL is an indispensable building block in the design of any analog or mixed-signal circuits in which a precise timing relationship must be established between two signals.

A number of different PLL designs are known in the art. In one particular design, a phase-frequency detector determines the deviation (error) from a desired timing relationship between the edges of a voltage controlled oscillator (VCO) generated signal and a reference signal. A charge pump generates a current proportional to the detected error, which is then integrated in a loop-filter to generate a control voltage controlling the output frequency of the VCO. The output frequency of the VCO is divided by a desired divisor and fed-back to the phase frequency detector for comparison against the reference signal and thereby close the loop. As the error changes, the control voltage varies the output frequency of the VCO such that the desired timing relationship between the edges of the VCO generated signal and those of the reference signal is maintained. Therefore, the output signal from the VCO ideally has a precise timing relationship with the reference signal.

One very important PLL design consideration is jitter, which generally is defined as the error in significant timing instances, such as the edges of the VCO output signal and/or the edges of the reference signal, from their ideal positions. One specific source of jitter is the charge pump, in PLLs using a charge-pump. For example, the charge pump may introduce a fixed offset charge into the loop filter, resulting in a deviation of the VCO control voltage from its ideal value. Compensation is possible by introducing a static timing skew between the reference and VCO generated signals and/or by introducing a charge of opposite polarity at the charge pump output. However, the compensation scheme may, in itself, introduce voltage ripples and mismatch thereby introducing dynamic jitter and skew into the system.

Glitching is another consideration. Voltage switching charge pumps generally pass bias currents through metal oxide semiconductor field effect transistor (MOSFET) switches biased in the triode region when in the "on" state. This technique, however, requires that the MOSFETs be driven by rail to rail logic signals at their gates, which causes large step voltages to couple across the gate to drain capacitances and consequently unacceptable glitching currents or charges. Glitching also occurs in voltage switching charge pumps due to inverter and gate delay mismatches and charge-sharing.

On the other hand, some current switching charge pumps utilize differential MOSFET pairs to switch bias currents into and out of an output node. This technique requires that both high and low levels be generated for controlling the gates of the differential pair. These levels are generated, for example, with two diode-connected MOSFETs biased in strong inversion at two different current densities. However, the output node must be driven with a low output impedance. As a result, large MOSFETs are required in the differential pair, as well as large bias currents. Additionally, the common mode voltage must be adjusted to ensure that the tail-current biasing transistor associated with the differential pair is maintained in the saturation region. Consequently, the entire circuit structure is highly sensitive to process corners (i.e. process-voltage-temperature or PVT).

In sum, new PLL techniques are required which minimize the amount of skew and jitter in the PLL output signal. Furthermore, output glitches should be substantially reduced without the need for large switching transistors or significant additional circuitry. These techniques should be particularly applicable to charge pump-based PLL circuits and the wide range of systems utilizing such circuits.

SUMMARY OF INVENTION

The principles of the present invention are embodied in circuits, systems, and methods, which reduce glitches at the output of a charge pump. According to one particular embodiment, a charge pump is disclosed which includes a differential pair of transistors for controlling a current at a charge pump output node and a replica bias generator for selectively driving a first transistor of the differential pair of transistors into a fully-on state and a second transistor of the differential pair of transistors into a weak inversion state.

When utilized in phase-locked loop applications, charge pumps embodying the inventive principles minimize the injection of offset charge into the loop filter, and, consequently, frequency deviations in the phase-locked loop output signal. In particular, the voltages controlling the charge pump output differential pairs are optimized to minimize current overshoot. Further, this voltage swing is self-adjusting across a range of process corners. Finally, the present inventive principles provide, in some embodiments, for the elimination of mismatch between transistors of differing semiconductor types.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–5 of the drawings, in which like numbers designate like parts.

Figure 1:
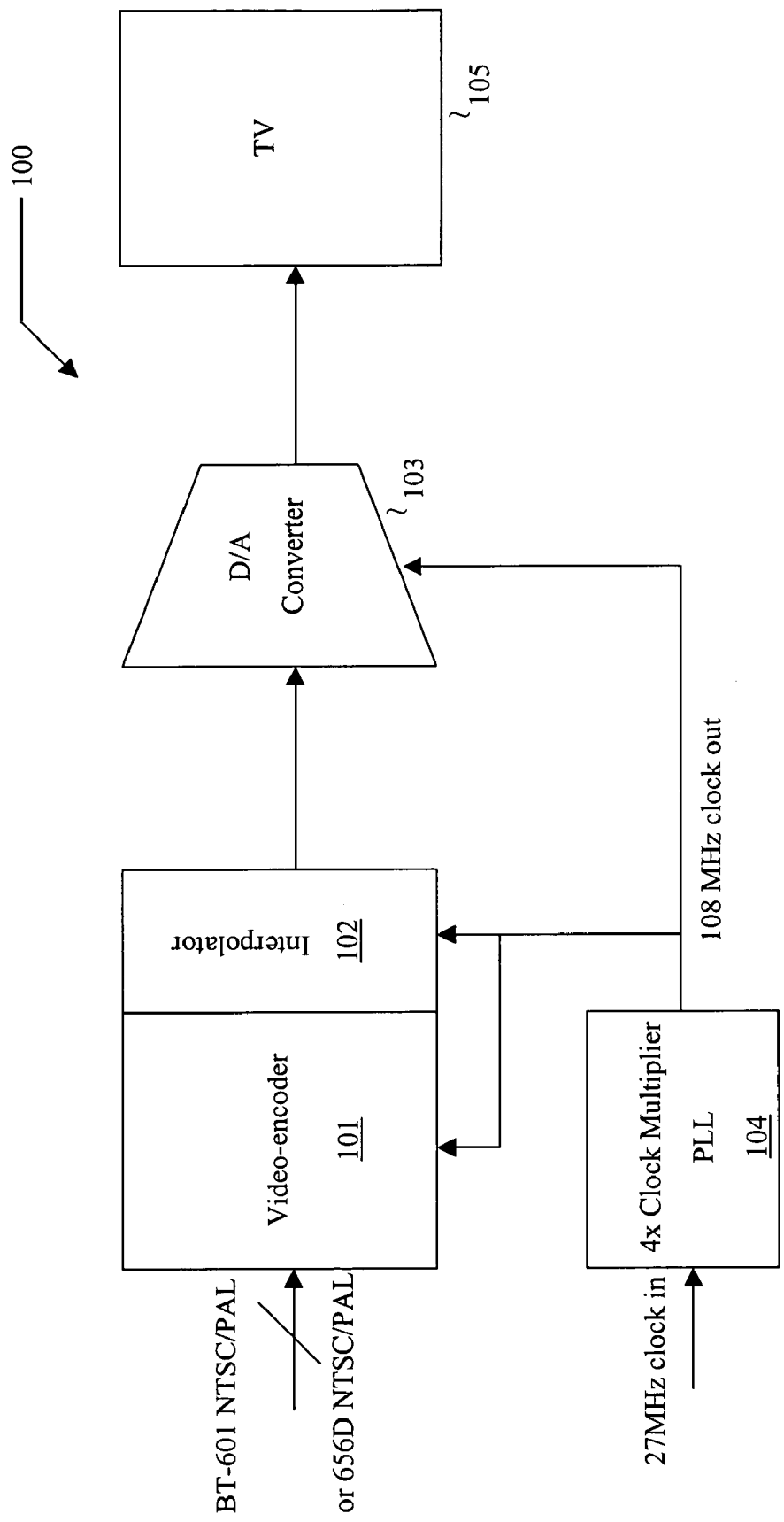
FIG. 1 is a high level block diagram of an exemplary video decoding system suitable for describing the present inventive principles.

FIG. 1 is a high-level block diagram of a video-encoder system 100 representing one of numerous possible system level applications of the present inventive principles. Video-encoder system 100 includes a video-encoder 101 which receives digital television data, such as digital television data formatted in the International Telecommunications Union standards ITU-R-BT.601 or ITU-R-BT.656D for either the NTSC (National Television System Committee) or PAL (Phase Alternating Line) formats.

The incoming digital television data are converted by video-encoder 101, in conjunction with an interpolator 102 and a digital to analog converter (DAC) 103, into an analog output stream suitable for driving a television (TV) 105. Television 105 is, for example, a standard definition television accepting composite analog signals in either the NTSC or PAL formats. Television 105 operates from data received in the red-green-blue (RGB), or is a progressive scan or high definition television.

Video-encoder 100 operates from a 27 MHz input clock signal, which is multiplied in a four-times (4×) clock multiplier phase-locked loop (PLL) 104, to generate a 108 MHz output clock signal. In the illustrated embodiment, PLL 104 is based on a charge pump design embodying the principles of the present invention.

Figure 2:
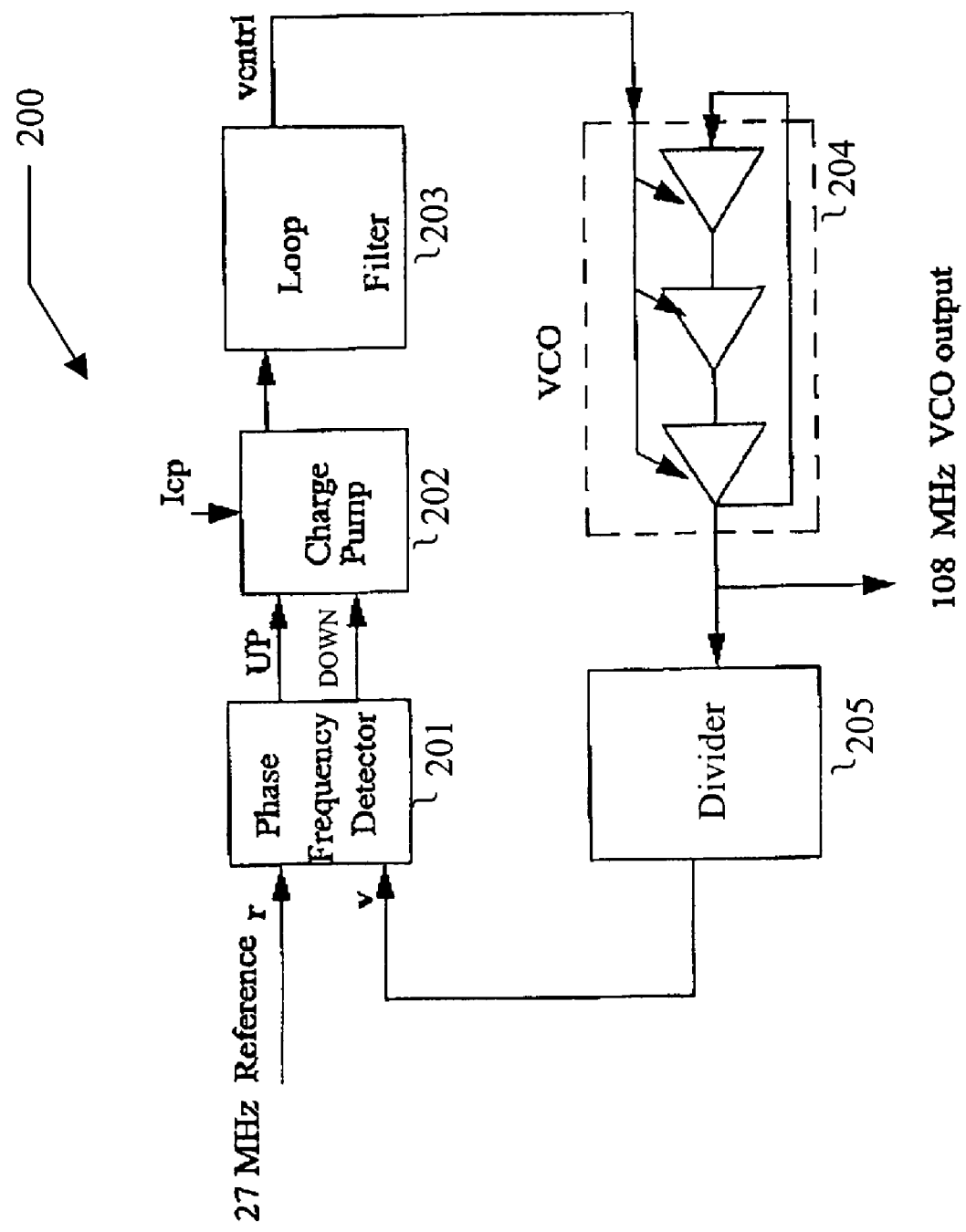
FIG. 2 is a high level block diagram of a phase-locked loop (PLL) embodying the principles of the present invention and suitable for use in the PLL subsystem of FIG. 1.

FIG. 2 is a high level block diagram of a phase-locked loop (PLL) 200 embodying the principles of the present invention and suitable for use in clock generation subsystem or PLL 104 of FIG. 1. PLL 200 includes a phase-frequency detector 201 that compares the phase between a reference signal and a feedback signal from the closed loop. Phase-frequency detector generates the signals UP and DOWN, based on the error between the reference and feedback signals. The signals UP and DOWN cause a charge pump 202 to generate a current proportional to the detected error.

A loop filter 203 generates a control voltage from the current output from charge pump 202 for controlling the output frequency of a voltage-controlled oscillator (VCO) 204. VCO 204 generates an output signal of a desired frequency and drives a divider 205, which in turn closes the loop by providing the feedback signal to phase-frequency detector 201.

Figure 3:
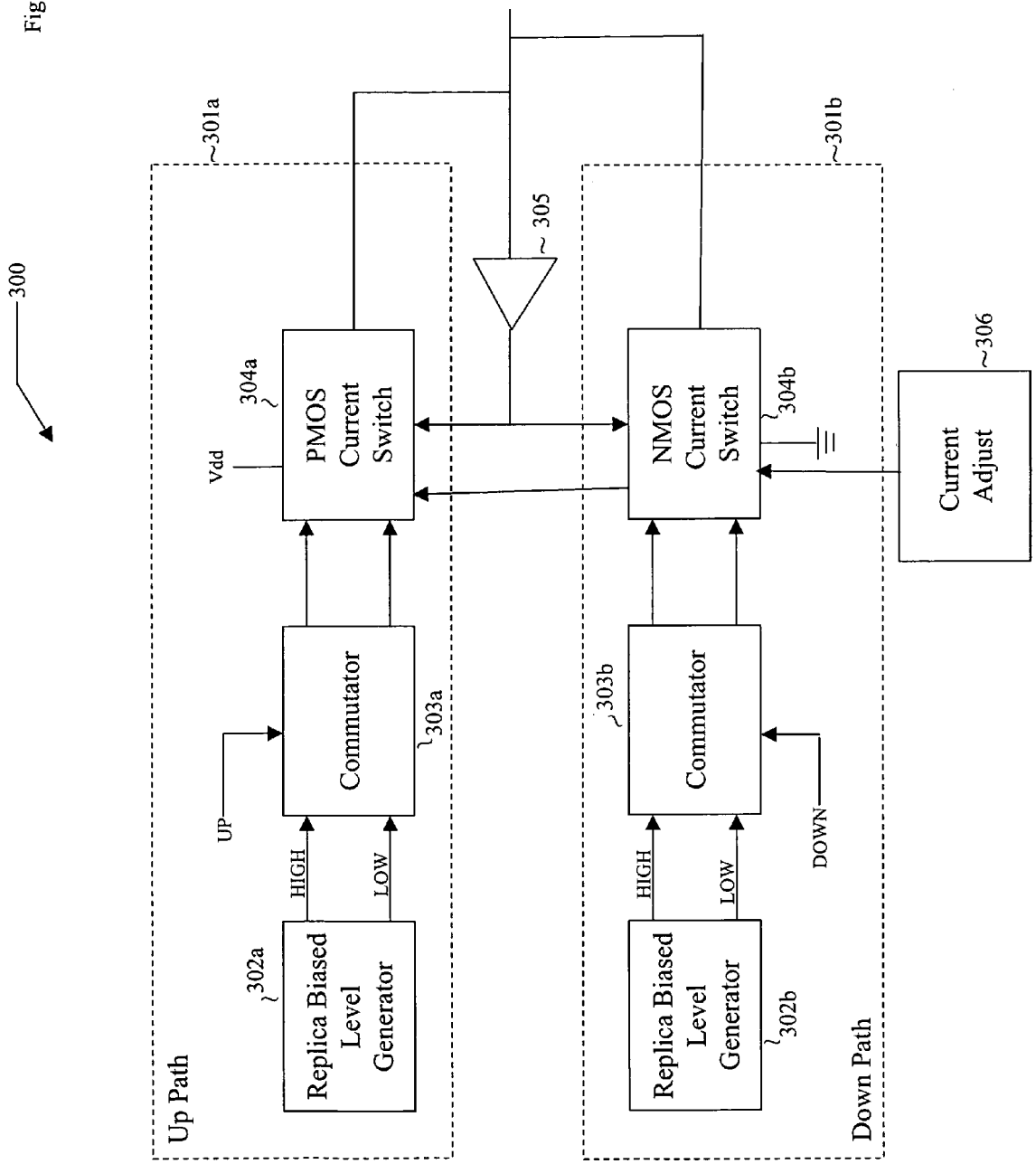
FIG. 3 is a block diagram of a charge pump with minimized over-shoot and under-shoot glitches across a wide range of output voltages and process corners, according to the principles of the present invention.

FIG. 3 is a block diagram of a charge pump 300 with minimized over-shoot and under-shoot glitches across a wide range of output voltages and process corners, according to the principles of the present invention. Charge pump 300 is suitable for utilization, in one application, as charge pump 202 of PLL system 200 shown in FIG. 2.

Charge pump 300 includes an up path 301a and a down path 301b, respectively controlled by the rail-to-rail UP and DOWN phase detection signals from phase-frequency detector 201 of FIG. 2. Each path 301a and 301b includes a respective replica bias level generator 302a or 302b, that generates a pair of signals HIGH and LOW of reduced swing voltage pulses. The HIGH and LOW signals from replica-bias generators 302a and 302b are modulated by corresponding commutators 303a and 303b, respectively by the phase detection signals UP and DOWN.

The outputs from up and down paths 301a and 301b are generated by corresponding PMOS current switch 304a and NMOS current switch 304b. As discussed below, current switches 304a and 304b are based on a differential pair controlled by the HIGH and LOW signals modulated by the UP and DOWN signals by commutators 303a and 303b. A unity gain buffer 305 provides feedback from the output of charge pump 300 to current switches 304a and 304b.

Figure 4:
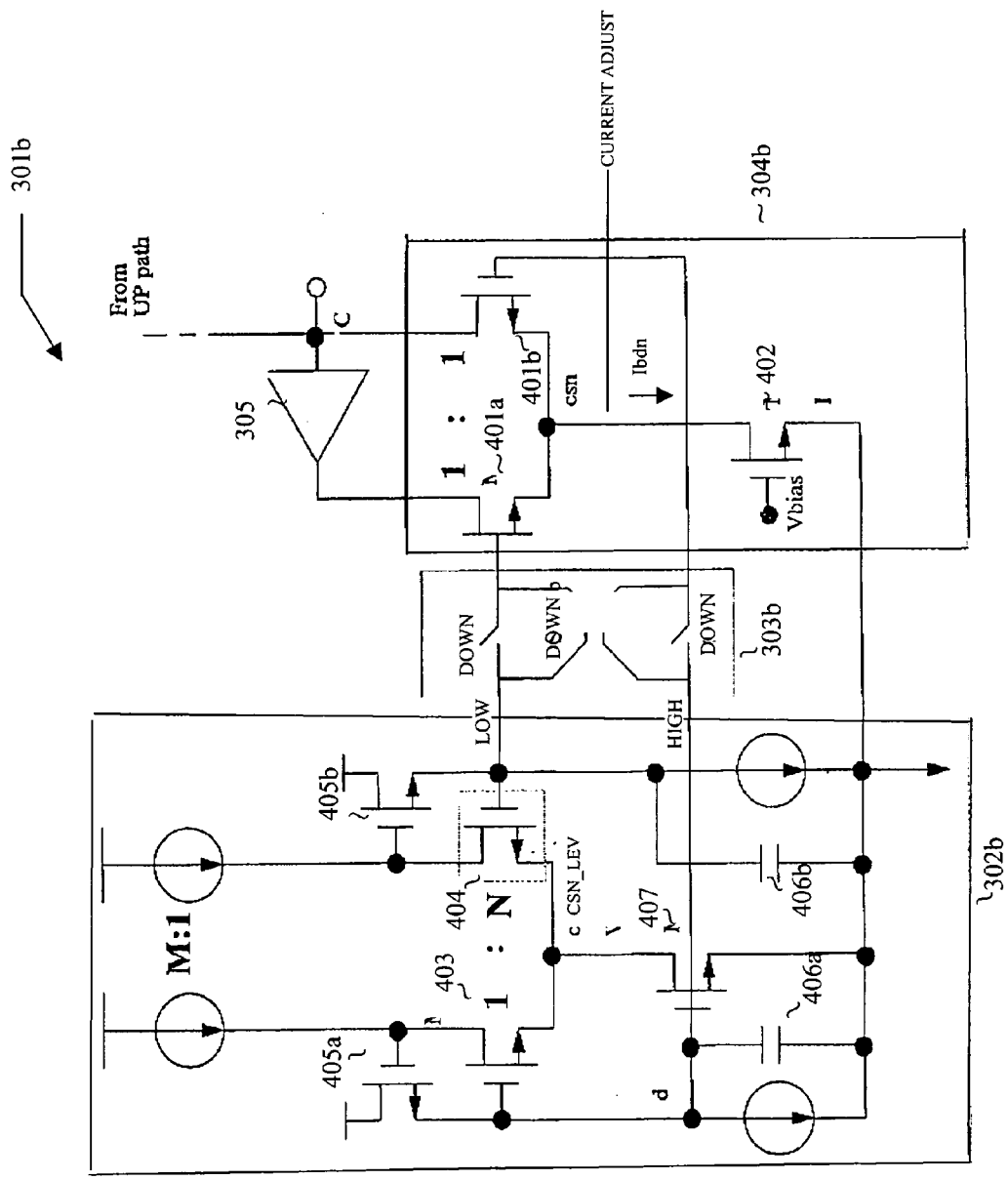
FIG. 4 is a more detailed electrical schematic of the down path of charge pump of FIG. 3.

FIG. 4 is a more detailed electrical schematic of down path 301b of charge pump 300 of FIG. 3. A similar internal structure is utilized in corresponding up path 301a with the exception that the differential pair transistor and associated tail current source transistor are PMOS transistors operating from the high voltage rail.

Down path current switch 304b of FIG. 3 includes a matched differential pair of transistors 401a and 401b and a source transistor 402. The voltages at the gates of differential pair transistors 401a and 401b are optimized across all process corners and output voltage levels to ensure low glitching currents and complete switching. In particular, to ensure complete cutoff of differential pair transistors 401a and 401b, a sufficiently large voltage difference is required between the HIGH and LOW signals. In a conventional charge pump, a current overshoot occurs in the output current of the charge-pump which increases directly with an increase in the voltage difference between them. Generally, this overshoot is due to the discharge of the gate to source parasitic capacitance (Cgs) and the gate to drain parasitic capacitance (Cgd) of the differential pair transistor 401a or 401b that is presently switching off. In a conventional PLL, this overshoot results in an error charge being introduced into the following the loop filter.

Reducing the voltage swing at the gates of differential pair transistors 401a and 401b will reduce the current overshoot in the HIGH and LOW signal; however, if the voltage swing is reduced below an optimal point, incomplete switching of differential pair transistors 401a and 401b will result. Incomplete switching of differential pair transistors 401a and 401b results in a loss of charge and static phase error or jitter.

Additionally, source transistor 402 must not enter the triode region and thereby reduce the tail current IBDN from differential pair transistors 401a and 401b. Specifically, the common mode voltage between the HIGH and LOW signals must be sufficient to ensure that the tail IBND current is at its maximum saturated value across all process corners.

According to the principles of the present invention, when the voltage levels at the gates of differential pair transistors 401a and 401b are set by replica bias generator 302b, as discussed in detail below, differential pair transistors 401a and 401b operate as follows.

Generally, whichever of differential pair transistors 401a and 401b is presently fully-on conducts almost all of the tail bias current IBDN through source transistor 402. However, the corresponding differential pair transistor 401a or 401b, which is presently "off", does not cutoff completely but is instead biased with a small value of sub-threshold current. For example, if the DOWN signal controlling corresponding down-path commutator 303b is currently high, then differential pair transistor 401b is in saturation and conducts almost the full current through source transistor 402, while a small amount of that current is conducted by differential pair transistor 401a. Thus, differential pair transistor 401a operates in the "weak-inversion" or "sub-threshold" region. The converse is true if the DOWN signal is low.

The optimal levels of the HIGH and LOW signals provided to the gates of differential pair transistors 401a and 401b by replica bias generator 302b are derived from the sizes of differential pair transistors 401a and 401b and source transistor 402. Specifically, the bias current in level setting transistor 403 of replica bias generator 302b matches the current through whichever differential pair transistor 401a or 401b is presently fully-on. The current through second level setting transistor 404 of replica bias generator 302b is approximately N times larger than the current through the corresponding differential pair transistor 401a or 401b presently in weak-inversion, since second level shifting transistor 404 is N times larger than differential pair transistors 401a and 401b themselves.

In the illustrated embodiment, level setting transistor 403 has the same dimensions as differential pair transistors 401a and 401b. Additionally, the total of the bias currents through level shifting transistors 403 and 404 of replica bias generator 302b is the same as the bias current IBDN through source transistor 402 of current switch 304b. Hence, the current flowing through transistor 404 is smoothly adjusted by controlling the product M*N, in which M is the ratio of the current through the level shifting transistor 403 to that in 404 and N (though the M:1 current mirror) is the ratio of the size of the level shifting transistor 404 to that of 403.

Large current ratios M and N (and therefore a large M*N product) ensure that transistor 404 is biased in weak inversion. Consequently, the current in the "off" transistor of the differential pair of transistors 401a and 401b is biased more into weak-inversion, since differential pair transistors 401a and 401b are 1/N the size of second level shifting transistor 404. Since level-shifting transistor 404 is in weak-inversion, it will be unable to drive any load; therefore, feedback through source-follower transistors 405a and 405b ensures that the HIGH and LOW signals are driven with low impedance. A pair of capacitors 406a and 406b is provided for filtering high-frequency transients.

The common-source node labeled CSN is nominally biased above the saturation voltage VDSAT (i.e. Vgs-Vt) of source transistor 402 to ensure that source transistor 402 remains in saturation. Specifically, the gate of transistor 407 of replica bias generator 302b is coupled to the gate of level shifting transistor 403 and the node labeled HIGH. Transistor 407 is sized such that the common-source nodes CSN and CSN_LEV are biased above VDSAT for source transistor 402. Utilizing principles similar to those utilized in wide-swing cascode bias designs, the output range for charge-pump 300 can be maximized as well as made process corner (PVT) independent. Furthermore, current switch transistors 401a and 401b also operate as cascode transistors to provide high output-impedance with high swing.

Mismatch in threshold voltage (Vt) and/or beta ($\mu$Cox·W/L) between level shifting transistors 403 and 404 and differential pair transistors 401a and 401b, as well as between differential pair transistors 401a and 401b themselves, can result in offset voltages and consequently higher leakage current in differential pair transistors 401a and 401b. SPICE-based Monte Carlo simulations indicate that the statistical variation in leakage current is about forty-percent (40%) around the mean value, with a variance of five percent (5%) in the threshold voltage (Vt) and two percent (2%) in the beta. The offset voltage in level shifting transistors 403 and 404 should therefore not exceed twenty five millivolts (25 mV) or one thermal voltage (VT), ), in which VT=kT/q, k being Boltzmann's constant, T the device temperature, and q the electron charge. At this level, the leakage current through the differential pair transistor 401a or 401b in the sub-threshold region will increase by approximately exp (Voff/n*VT), in which n is the sub-threshold slope of a MOS transistor.

For a typical MOS transistor with n=1.4 and VT=25 mV, the leakage current will increase by a factor of about two (2). This increase in leakage current may be compensated for by increasing the product M*N by a factor of two (2), although the glitch voltage will also proportionally increase by approximately 6.3%, for a differential swing (VH-VL) of approximately 400 mV.

Current adjust block 306 of FIG. 3 provides adjustment currents CURRENT ADJUST that ensure that the effective charge-pump up and down currents are equalized to minimize mismatch related jitter.

Charge pump 300 has significant advantages. For example, only enough reduced voltage swing is presented to the gates of differential pair transistors 401a and 401b to guarantee complete current transfer across the current-switch differential pair transistors 401a and 401b. Minimizing the voltage difference between the gates of differential pair transistors 401a and 401b reduces spikes during transistor turn-off. Furthermore, this voltage swing varies automatically with process corner (PVT). Charge pump 300 is also self-biased such that charge-pump output range can go down to the VDSAT of transistor 401a plus the VDSAT of transistor 402 above ground, across all process corners (PVT).

Figure 5:
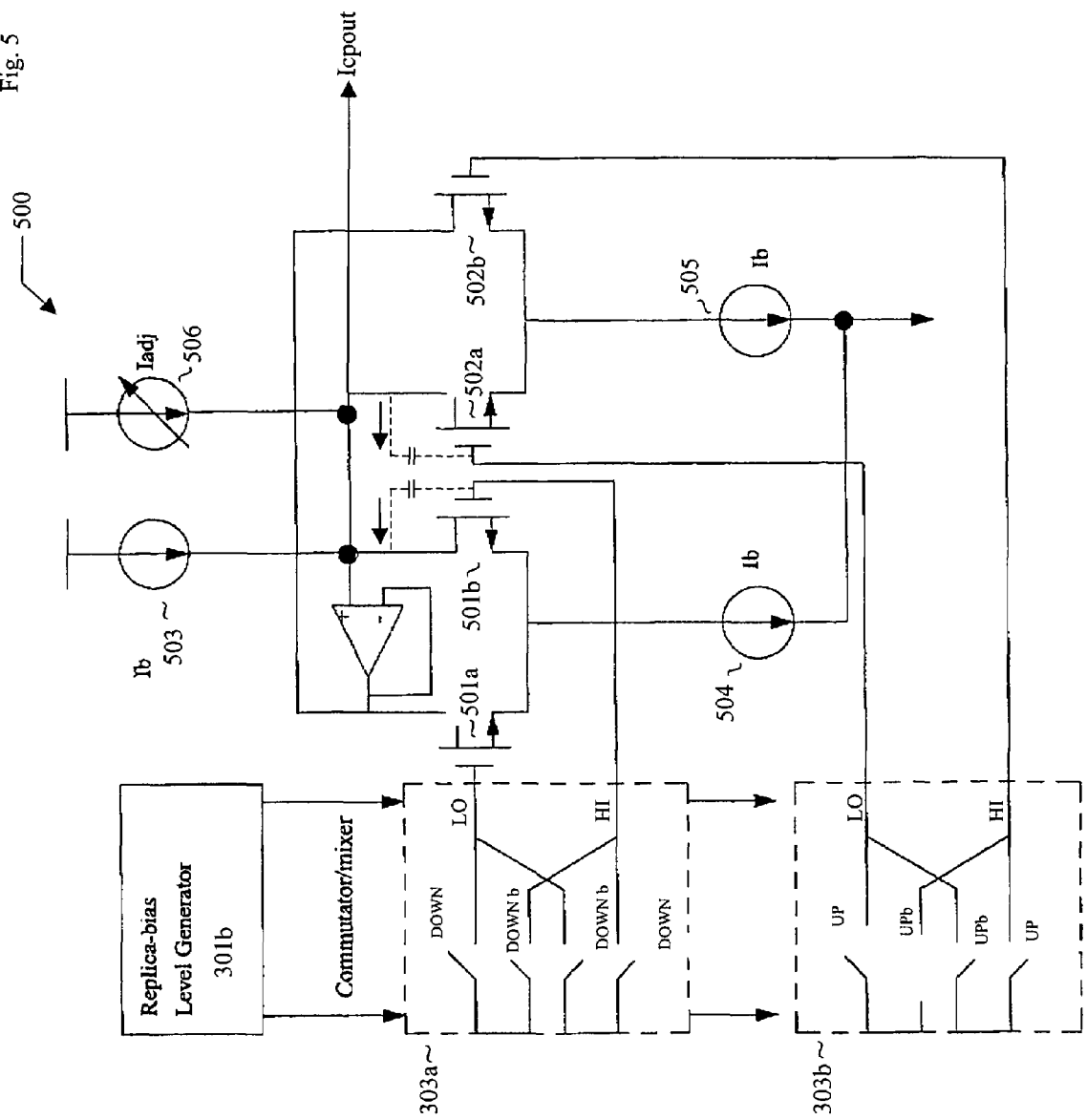
FIG. 5 illustrated is an alternate embodiment of a charge pump according to the present inventive principles in which glitch components due to transistor mismatch are eliminated.

Glitch components due to mismatch between NMOS and PMOS type current switches such as 304a and 304b of FIG. 3 are eliminated by using NMOS only current switches in charge pump 500 shown in FIG. 5. Charge pump 500 is based on replica bias level generator 301b shown in FIG. 4, and differential pairs respectively formed by NMOS transistors 501a and 501b and 502a and 502b operating from fixed current sources 503–505. The bias currents through sources 503, 504 and 505 are equal. An adjustable current source 506 provides an additional (bidirectional) adjustment current to compensate for the current that would flow normally into the output of a conventional charge pump due to the systematic and random mismatches in PMOS and NMOS bias current sources.

Charge pump 500 also provides significant advantages. For example, since only NMOS current switches are used, the switching speeds are not limited by the lower threshold voltages of PMOS devices, and, generally, the higher transition frequency ($f_T$) NMOS devices help guarantee a higher overall speed of operation. (The transition frequency is the measurement of the analog speed of a given transistor and is given by gm/Cgs, in which gm is the transconductance and Cgs is the gate to source parasitic capacitance). Mismatch between the characteristics of the PMOS and NMOS current switches is eliminated. Note that the process (PVT) independence characteristics noted in the DN Path (301b) of the charge-pump 300 of FIG. 3, as noted in paragraph [0033] are preserved.

During the simultaneous switch-on and switch-off of the signals UP and DOWN, the two current switches formed by transistors 501a and 501b and 502a and 502b, respectively, work in opposite directions, with one steering the current away from, and the other steering current towards, the output. In particular, for charge pump 500 shown in FIG. 5, if the UP and DOWN signals are both transitioning from a logic low voltage to a logic high voltage, displacement (glitch) currents flow in opposite directions through the parasitic gate-drain capacitances (Cgd) of transistors 502a and 501b, shown by dashed lines in FIG. 5, into the output node ICPOUT. As a result, the glitches at the output node ICPOUT cancel. This technique helps to improve current glitches during the small interval when an error charge is pumped into the loop filter during the beginning of the reference clock cycle when the charge-pump turns on in a locked PLL. Finally, charge pump 500 provides design simplicity due to the reduced number of blocks, which must be designed and/or optimized.

The present inventive principles advantageously minimize the amount of skew and jitter in the output signal of a PLL or other circuit. Furthermore, output glitches are substantially reduced without the need for large switching transistors or significant additional circuitry. The present inventive principles are particularly applicable to charge pump-based PLL circuits and the wide range of systems utilizing such circuits, although not limited thereto.

While a particular embodiment of the invention has been shown and described, changes and modifications may be made therein without departing from the invention in its broader aspects, and, therefore, the aim in the appended claims is to cover all such changes and modifications that fall within the true spirit and scope of the invention.

What is claimed is:

1. A current switch comprising:
   a differential pair of transistors for controlling a current at a current switch output node; and
   a replica bias generator for selectively driving a first transistor of the differential pair of transistors into a fully-on state and a second transistor of the differential pair of transistors into a weak inversion state, the bias current generator including a first transistor and a second transistor, the first transistor of the replica bias generator having a size of a multiple of a size of the second transistor of the replica bias generator and biased with a bias current of a multiple of a bias current of the second transistor of the replica bias generator for driving the first transistor of the differential pair into the fully-on state and the second transistor of the replica bias generator biased in weak inversion for driving the second transistor of the differential pair into the weak inversion state.

2. The current switch of claim 1, wherein the differential pair sources current to the output node.

3. The current switch of claim 1, wherein the differential pair sinks current from a differential node.

4. The current switch of claim 1, wherein a size of the first transistor of the replica bias generator matches a size of the first and second transistors of the differential pair.

5. The current switch of claim 1, wherein:
   the first and second transistors of the differential pair are coupled to a first source transistor; and
   the first and second transistors of the replica bias level generator are coupled to a second source transistor, the second source transistor sized and biased such that the first source transistor is saturated.

6. The current switch of claim 1, wherein the replica bias level generator further comprises:
   a source-follower transistor coupled to the second transistor of the replica bias level generator for driving the second transistor of the differential pair.

7. The current switch of claim 1, further comprising a third transistor having a drain coupled to sources of the first and second transistors of the replica bias generator, and having a gate coupled to a gate of the first transistor.

8. A current switch comprising:
   a differential pair of transistors for controlling a current at a current switch output node; and
   a replica bias generator for selectively driving a first transistor of the differential pair of transistors into a fully-on state and a second transistor of the differential pair of transistors into a weak inversion state; and
   a commutator for selectively coupling the first transistor of the replica bias level generator to the first transistor of the differential pair and the second transistor of the replica bias level generator to the second transistor of the differential pair.

9. A method of generating an output signal of a current switch comprising:
   controlling a current at a current switch output node with a differential pair of transistors; and
   driving a first transistor of the differential pair of transistors into a fully-on state with a first transistor of a replica bias level generator and a second transistor of the differential pair of transistors into a weak inversion state with second transistor of the replica bias level generator, the first transistor of the replica bias level generator having a size of a multiple of a size of the second transistor of the replica bias level generator, comprising:
   biasing the first transistor of the replica bias level generator with a bias current of a multiple of a bias current biasing the second transistor of the replica bias level generator; and
   biasing the second transistor of the replica bias generator in weak inversion.

10. The method of generating an output signal of claim 9, further comprising coupling the drains of a third transistor to sources of the first and second transistors of the replica bias generator, the third transistor having a gate coupled to a gate of the first transistor.

11. The method of generating an output signal of claim 9, further comprising sizing the first transistor of the replica bias generator to match a size of the first and second transistors of the differential pair.

12. The method of generating an output signal of claim 9, further comprising: coupling the first and second transistors of the differential pair to a first source transistor;
   coupling the first and second transistors of the replica bias level generator to a second source transistor; and
   sizing and biasing the second source transistor such that the first source transistor is saturated.

13. A system including a charge pump comprising:
   a first differential pair of transistors for selectively sourcing current to a charge pump output node;
   a second differential pair of transistors for selectively sinking current from the charge pump output node;
   at least one replica bias level generation circuit for selectively driving a selected one of the first and second differential pairs of transistors, the replica bias level generator driving a first transistor of the selected differential pair of transistors into a fully-on state and a second transistor of the selected differential pair of transistors into a weak inversion state; and
   a commutator for selecting the first transistor of the selected differential pair to be driven into the fully-on state and second transistor of the selected differential pair to be driven into the weak inversion state.

14. The system of claim 13, wherein the at least one replica bias generation circuit selectively drives the first and second differential pairs of transistors.

15. The system of claim 13, wherein the first and second differential pairs each comprise n-type metal oxide semiconductor field effect transistors.

16. The system of claim 13, wherein the charge pump forms a portion of a phase-locked loop.

17. The system of claim 13, further comprising circuitry for providing a correction current to the first and second differential pairs for correcting for small currents flowing through transistors in the weak inversion state.

18. A charge pump comprising:

first and second differential transistor pairs controlling a current at a charge pump output node, a drain of a selected transistor of the first differential transistor pair coupled with a drain of a selected transistor of the second differential pair and the charge pump output node to cancel glitch currents at the charge pump output node;

a replica bias generator generating first and second control signals, the first control signal selected to drive a first transistor of each of the first and second differential transistor pairs into a fully-on state and the second control signal selected to drive a second transistor of each differential transistor pair of into a weak-inversion state;

a first commutator for selectively switching the first and second control signals to the first and second transistors of the first differential transistor pair; and a second commutator for selectively switching the first and second control signals to the first and second transistors of the second transistor pair.

19. The charge pump of claim 18, wherein the first and second transistors of the first differential transistor pair and the first and second transistors of the second transistor pair are of the same semiconductor type.

20. The charge pump of claim 18, wherein the first and second transistors of the first differential transistor pair and the first and second transistors of the second transistor pair comprise N-type metal oxide semiconductor field effect transistors.

* * * * *